United States Patent [19]

Shoji

[11] Patent Number: 5,117,130

[45] Date of Patent: May 26, 1992

[54] INTEGRATED CIRCUITS WHICH COMPENSATE FOR LOCAL CONDITIONS

[75] Inventor: Masakazu Shoji, Warren, N.J.

[73] Assignee: AT&T Bell Laboratories, Murray Hill, N.J.

[21] Appl. No.: 531,961

[22] Filed: Jun. 1, 1990

[51] Int. Cl.$^5$ ............... H03K 19/003; H03K 19/094; H03K 19/20; H03K 17/06
[52] U.S. Cl. ................................ 307/443; 307/448; 307/451; 307/452; 307/491
[58] Field of Search ............... 307/443, 542, 475, 450, 307/451, 452, 453, 448, 585, 572, 270, 491; 323/315, 316

[56] References Cited

U.S. PATENT DOCUMENTS

| 4,453,094 | 6/1984 | Peil et al. | 307/500 X |
| 4,613,772 | 9/1986 | Young | 307/443 |
| 4,714,840 | 12/1987 | Proebsting | 307/443 |
| 4,763,021 | 8/1988 | Stickel | 307/443 X |
| 4,806,798 | 2/1989 | Kanauchi | 307/443 X |
| 4,810,902 | 3/1989 | Storti et al. | 307/443 X |
| 4,818,901 | 4/1989 | Young et al. | 307/443 X |
| 4,857,764 | 8/1989 | Young | 307/443 |
| 4,857,767 | 8/1989 | Little et al. | 307/448 |

OTHER PUBLICATIONS

M. Shoji, CMOS Digital Circuit Technology, Prentice-Hall, Englewood Cliffs, NJ, 1998, pp. 210-221 and 329-341.

Primary Examiner—Edward P. Westin
Assistant Examiner—David R. Bertelson
Attorney, Agent, or Firm—Gordon E. Nelson

[57] ABSTRACT

Apparatus for compensating for the effect of a local condition on an active element in a portion of an integrated circuit. The apparatus includes a detecting element in the portion of the integrated circuit which is subject to the local condition and produces a response to the local condition which is proportional to the local condition's effect on the active element and a compensation element which is coupled to the detecting element and to the portion for reacting to the response of the detecting element tot he local condition by providing a compensating input to the portion which is proportional to the response and which compensates for the local condition's effect on the active element. An embodiment of the apparatus which compensates for leakage currents in FETs in a dynamic CMOS integrated circuit employs one or more FETs which are interspersed among active FETs as the detecting element and a current mirror as the compensating element. The current mirror responds to the leakage current in the detecting element FETs by producing a compensating current to compensate for the leakage current in the active FETs. The embodiment is employed in a dynamic NOR gate and a dynamic PLA.

15 Claims, 3 Drawing Sheets

INTEGRATED CIRCUITS WHICH COMPENSATE FOR LOCAL CONDITIONS

TECHNICAL FIELD

The invention concerns integrated circuits generally and particularly concerns integrated circuits in which the behavior of active elements is affected by conditions local to the portion of the integrated circuit containing the active element. Examples of such local conditions are local differences in feature sizes, local temperature differences, and local noise.

BACKGROUND OF THE INVENTION

1. Field of the Invention

One area in which local conditions affect the behavior of active elements of an integrated circuit is leakage current. The transistors used in certain types of state-of-the-art integrated circuits are inherently "leaky", i.e., even when the transistor is turned off, there is a flow of current from source to drain. As feature size decreases and circuit complexity increases, leakage curent when a transistor is off becomes both more important and more subject to local conditions. One class of integrated circuits in which leakage current has become an important problem is those which employ dynamic gates fabricated from CMOS FETs. Such integrated circuits are described in Chapter 5 of Masakazu Shoji. *CMOS Digital Circuit Technology*. Prentice-Hall. Englewood Cliffs, N.J. 1988 (henceforth "Shoji"). In CMOS FETs, the problems posed by the inherent leakage current increase as the feature size decreases and the complexity of the circuit increases for the following reasons:

- As the size of a CMOS FET decreases, its threshold voltage generally decreases, either because power supply voltage is decreased or the design requires the higher performance possible with lower threshold voltages. As the threshold voltage decreases, the leakage current increases exponentially.
- As the complexity of the system constructed in a single integrated circuit increases, more complex logic gates are required to process signals efficiently and there may be as many as several hundred FETs connected to a node. As the number of FETs connected to a node increases, the difference between the leakage current in the node and the current which flows when only one of the FETs is on decreases.
- As the device number increases and the device size decreases, local variations in device geometry, in temperature, and in electrostatically induced noise increasingly influence the leakage current through a given FET.

For all of the above reasons, the inherent leakage of CMOS FETs is regarded by those skilled in the art as a limitation on the use of CMOS FETs in certain very large integrated circuits such as dynamic programmable logic arrays (PLAs) and dynamic memories.

2. Description of the Prior Art

FIG. 1 shows a prior-art solution to leakage current in dynamic CMOS gates. Circuit 101 is taken from page 213 of Shoji. It implements a three-input NOR gate. The inputs to the NOR gate are labeled A, B, and C, and the output is labeled O. The circuit is made of two kinds of CMOS field-effect transistors (FETs). FETs 103 and 107 are PFETs; the remaining FETs are NFETs. The functional difference between the two types is that a PFET conducts when its gate is at a low voltage, while a NFET conducts when its gate is at a high voltage. The FETs in circuit 101 have the following functions:

- NFETs 105, 117, and 119 implement the NOR function.
- PFET 103 precharges output node 111.
- NFET 115 is a ground switch. When it is on, it grounds the source electrodes of NFETs 105, 117, and 119.
- PFET 107 is a usually small FET which compensates for leakage current through NFETs 105, 117, and 119 when those FETs are off.

Operation of circuit 101 is controlled by clock signal 113. When clock 113 is low, PFET 103 is on and NFET 115 is off; as a consequence, line 111 is *precharged* to $V_{DD}$. When clock 113 goes high, PFET 103 is off and NFET 115 is on; consequently, if any of NFETs 105, 117, or 119 is on, i.e., if any of lines A, B, or C has a logic high value, output line 111 is grounded; if none of lines A, B, or C has a logic high value, output line 111 remains at $V_{DD}$ to which it was precharged. The relationship between the states of lines A, B, and C and that of output line O 111 is thus that of the logic NOR function.

As indicated above, there is a leakage current through NFETs 105, 117, and 119 when those FETs are off. The gate of PFET 107 is grounded, and consequently that PFET is always on; PFET 107 is sized such that the flow of current through PFET 107 is on the one hand able to compensate for the leakage of current through NFETs 105, 117, and 119 when NFETs 105, 117, and 119 are all off and is on the other hand small enough so that output line 111 is close to ground potential when one or more of NFETs 105, 117 and 119 is on.

PFET 107's compensation for the leakage currents through NFETs 105, 117, and 119 comes at a cost. Because it is impossible to closely estimate the leakage current of NFETs 105, 117, and 119 when the integrated circuit is designed, PFET 107 is always designed to supply more current than the actual leakage current; consequently, when one of NFETs 105, 117, and 119 is on, output line 111 does not go completely to ground. If, as in the case of CMOS PLAs, output line 111 is an input for another gate, the logical behavior and the noise sensitivity of that gate may be affected by the fact that output line 111 does not go completely to ground.

The problems posed by PFET 107 increase as feature size decreases and circuit complexity increases. First, as threshold voltages decrease, a dynamic CMOS gate which takes output line 111 as an input becomes more sensitive to the fact that output line 111 is not at ground when one of NFETs 105, 117, and 119 is on. One consequence of this sensitivity is an increase in leakage current in that CMOS gate. Second, as leakage current increases and the number of FETs connected to a node increases, the difference between the total leakage current and the current resulting from any one of NFETs 105, 117, and 119 being on decreases. The leakage current for a node with n NFETs connected to it is $n \cdot I_L$. If the node is to function satisfactorily as a logical device, the current $I_O$ which results when only one of the NFETs connected to the node is on must be substantially greater than $n \cdot I_L$. Third, as the density of the integrated circuit and its speed increase, the noise in the circuit increases and the leakage current increases proportional to the exponential of the noise voltage. Finally, as the number of devices increase, the effects of locality also increase. For example:

A given NFET may be located at some distance from PFET 107 and, as a consequence of imperfections in the process which produces the integrated circuit, may have an $I_L$ greater or less than what was specified.

The given NFET may be in a location in the integrated circuit which is warmer or cooler than the location of PFET 107, again producing $I_L$ greater or less than what was specified.

The given NFET may be in a location in the integrated circuit where gate capacitance is greater or lesser than at the location of PFET 107. Since gate capacitance of a FET is related to its leakage current, the effect is to again produce $I_L$ greater or less than specified.

Thus, as circuit speed, density, and complexity increase and $n \cdot I_L$ and $I_O$ approach each other, a current source such as PFET 107 which provides a fixed current flow becomes more and more unsatisfactory. What the art requires, and what is provided by the apparatus disclosed herein, is an integrated circuit in which compensation for effects caused by local conditions (in this case, the leakage current), is exactly proportional to the effect being compensated for.

SUMMARY OF THE INVENTION

In generic terms, the apparatus disclosed herein compensates for the effect of a local condition on an active element in a portion of an integrated circuit. The apparatus includes at least the following components:

a detecting element in the portion which is subject to the local condition and produces a response thereto which is proportional to the effect of the local condition on the active element; and compensation means connected to the detecting element and to the portion for reacting to the response of the detecting element to the local condition by providing a compensating input to the portion which is proportional to the response and which compensates for the effect of the local condition on the active element.

In an important subgenus of the apparatus, a plurality of local conditions may affect members of a first plurality of active elements. There is a second plurality of detecting elements interspersed among the active elements. The compensation means is coupled to all of the detecting elements and reacts to their responses to the local conditions to produce the compensating input.

One species of the apparatus compensates for a first leakage current. The species includes at least the following components:

a leakage current determination component which is incorporated into the portion of the integrated circuit and which has a second leakage current which is proportional to and varies with the first leakage current and a compensating current providing component which is connected to the leakage current determination means and to the portion and which receives the second leakage current and responds to the second leakage current by producing a compensating current substantially equal to the first leakage current and providing the compensating current to the portion.

The leakage current determination component may be one or more devices contained in the portion which are subject to the same environmental influences as the devices whose leakage is being compensated for. The compensating current providing component may be a current mirror. A preferred embodiment of the apparatus is implemented in a dynamic CMOS PLA.

It is thus an object of the invention to provide an improved integrated circuit;

it is another object of the invention to provide an integrated circuit in which a leakage current is compensated by a current which is exactly as large as the leakage current;

it is a further object of the invention to provide an improved dynamic CMOS integrated circuit; and it is an additional object of the invention to provide an improved dynamic CMOS PLA.

These and other objects of the invention will become apparent to one of ordinary skill in the art upon consideration of the following Detailed Description and Drawing, wherein:

Figure 1:
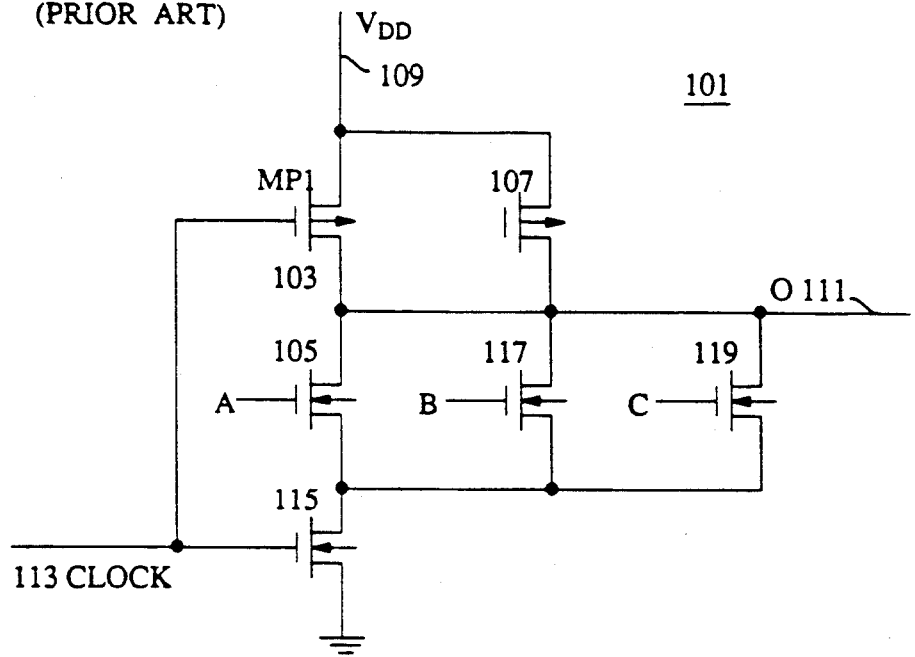
FIG. 1 is a schematic diagram of a prior-art 3-input NOR gate implemented using dynamic CMOS.

Reference numbers employed in the Drawing and the Specification have three digits; the rightmost two digits are a reference number within a figure and the leftmost digit is the number of the figure in which the item specified by the reference number first appears. For example, the item specified by 115 first appears in FIG. 1.

DETAILED DESCRIPTION

The following detailed description of apparatus embodying the invention will begin with an overview of such apparatus, continue with a three-input NOR gate embodying the invention, and conclude with a component of a PLA which embodies the invention.

OVERVIEW OF THE APPARATUS: FIG. 2

Figure 2:
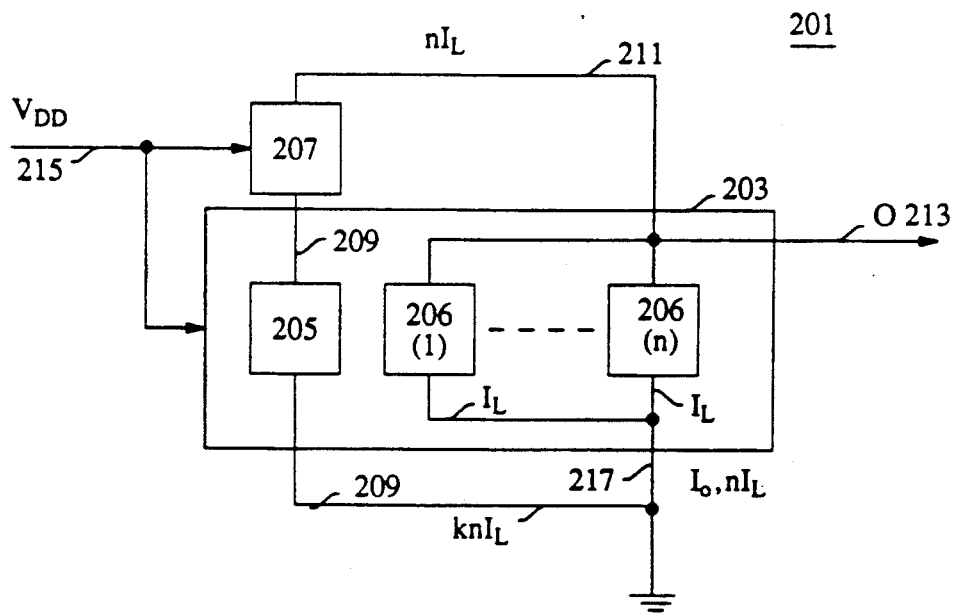
FIG. 2 is a conceptual block diagram of the apparatus disclosed herein.

FIG. 2 is a conceptual block diagram of apparatus which compensates for a leakage current by providing a compensating current which is proportional to the leakage current. Power is provided to the apparatus by line 215, which is at $V_{DD}$. Block 203 is a portion of an integrated circuit which includes elements which have an inherent leakage when off. The elements belong to two classes: active elements 206(1 ... n) and at least one leakage detection element 205. Active elements 206 determine the output of the portion on output line 213. Each active element 206 has an inherent leakage $I_L$ when off, giving a total inherent leakage of $n \cdot I_L$ through grounded line 217. When one of active elements 206 is on, line 217 further carries $I_O$.

Leakage detection element 205 detects the amount of inherent leakage in portion 213. Element 205 shares the environment of active elements 206 and is affected by that environment in the same fashion as active elements 206, but has no effect whatever on the state of output line 213. Like active elements 206, leakage detection element 205 leaks current to ground via line 209; the amount of current it leaks is proportional to $n \cdot I_L$ and varies with $n \cdot I_L$, as indicated by the notation $k \cdot n \cdot I_L$. Generally, k is less than 1.

Leakage detection element 205 is connected via line 209 to compensating current providing component 207. Because leakage detection element 205 is leaky, the current $k \cdot n \cdot I_L$ flows through line 209. Compensating current providing component 207 is capable of providing a compensating current on line 211 which is proportional to and varies with the current on line 209. The compensating current is provided to output line 213. In apparatus 201, the proportion between the current $k \cdot n \cdot I_L$ on line 209 and the compensating current on line 211 is chosen such that the compensating current is equal to the leakage current $n \cdot I_L$. Since the compensating current is not only equal to the leakage current, but varies with the leakage current, the result is that the compensating current always completely compensates for the leakage current, even when the leakage current varies due to changes in the environment of portion 203.

As set forth above, the fundamental principle embodied in apparatus 201 is the following: that the effects of local conditions on active elements in a circuit are compensated for by means of one or more detecting elements and a compensating component. The detecting elements are in the same portion of the integrated circuit as the active elements and are affected by the local conditions in a manner which is proportional to the effects of the local conditions on the active elements. The compensating component responds to the detecting elements by providing accurate compensation to the circuit for the effects of all of the local conditions.

Apparatus employing this principle may be employed to deal with effects other than leakage currents. For example, digital data transmission systems which operate at a high rate require logic which receives an input pulse and produces an output pulse of substantially the same width. As the logic employed in such systems grows more complex, the circuits become more and more sensitive to local conditions and it becomes more and more difficult to maintain pulse width. Apparatus employing the principle of apparatus 201 could deal with this problem by providing a second path for the input pulse whose purpose was to determine the effects of the local conditions on the pulse width and circuitry which responded to the second path by compensating for the effect of the local conditions on the pulse width.

A 3-INPUT NOR GATE WITH LEAKAGE CURRENT COMPENSATION: FIG. 3

Figure 3:
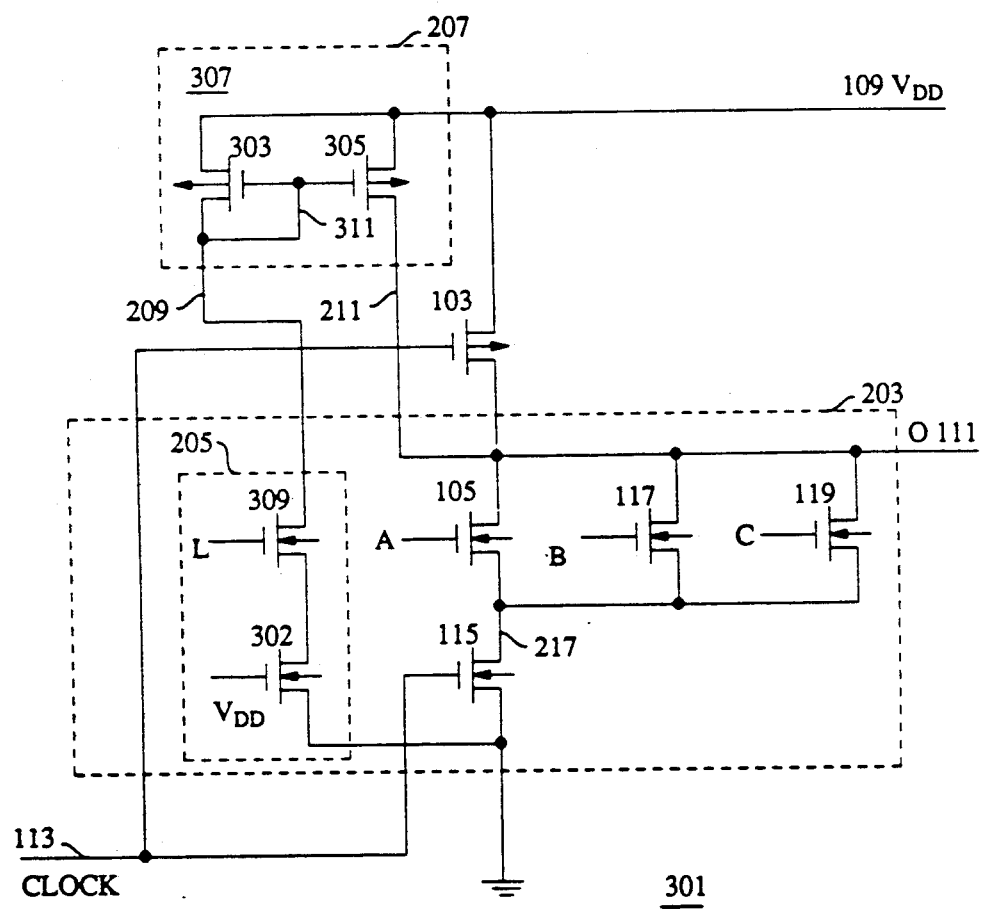
FIG. 3 is a schematic diagram of a 3-input NOR gate embodying the apparatus.

FIG. 3 is a schematic drawing of circuit 301, which is a 3-input NOR gate implemented in CMOS FETs which embodies the apparatus of FIG. 2. The NOR gate is implemented in the same fashion as the NOR gate of FIG. 1, except that leakage compensating PFET 107 has been replaced by a leakage detection element 205 and a compensating current providing component 207. Elements in FIG. 3 which have counterparts in FIGS. 1 and 2 are referred to with the reference numbers used for the corresponding elements in those figures.

Leakage detection element 205 in circuit 301 consists of an NFET 309 whose gate is permanently grounded and another NFET 302 whose gate is permanently at VDD. NFET 309 is in the same region of circuit 301 as NFETs 105, 117, and 119, and is consequently subject to the same local effects. Similarly, NFET 302 is in the same region of circuit 301 as NFET 115 and is subject to the same local effects as that device. NFET 309 and NFET 302 are, however, not connected between output line 111 and ground line 217, and consequently have no effect whatever on the state of output line 111. NFET 309 is designed such that the leakage current for NFET 309 is proportional to the leakage current $n \cdot I_L$ produced by NFETs 105, 117, and 119. NFET 302 is designed such that the current which flows through it when it is on is the same as the current which flows through NFET 115 when that device is on. Since NFET 309 is always off and NFET 302 is always on, line 209 always carries leakage current $k \cdot n \cdot I_L$.

The main component of compensating current providing component 207 in circuit 301 is current mirror 307, consisting of PFETs 303 and 305. Current mirrors are well-known in the art. See for example Otto H. Schade, Jr., *CMOS/Bipolar Linear Integrated Circuits*, Digest of Technical Papers, 1974 IEEE International Solid-State Circuits Conference, New York, 1974, pp. 136-137. A current mirror has two sides, indicated in FIG. 3 by lines 209 and 211 respectively. The circuit has the property that when a current flows on one of the sides, in this case, in line 209, a proportional current flows on the other side, in this case, line 211. The principle upon which the current mirror operates is visible from the schematic: line 311 connects line 209 to the gates of both PFET 303 and PFET 305; as indicated above, current flow through a PFET increases as the charge on the PFET's gate decreases. The charge on line 311 depends on the current leakage in NFET 309; as current leaks through NFET 309, the charge on line 311 drops and the flow of current through both PFET 303 and PFET 305 increases. The flow of current through line 211 is thus directly proportional to the flow of current through line 209. The current mirror may be designed to achieve any desired proportion between the current flowing through line 209 and the current flowing through line 211. For example, if circuit 301 is designed so that NFET 309 and NFETs 105, 117, and 119 are identical, then k in $k \cdot n \cdot I_L$ will be $\frac{1}{3}$ and current mirror 307 will be designed to provide a current flow in line 211 which is three times the current flow in line 209.

As was the case with circuit 101, operation of circuit 301 is controlled by clock 113. When clock signal 113 is low, PFET 103 is on and NFET 115 is off; consequently, line 111 is at $V_{DD}$. When clock signal 113 goes high, PFET 103 is off and NFET 115 is on. Independently of this, the leakage current $k \cdot n \cdot I_L$ is flowing through NFETs 309 and 302, causing current mirror 307 to produce a compensating current proportional to the leakage current on line 211; if NFETs 105, 117, and 119 are all off, the compensating current on line 211 compensates for the leakage current through NFETs 105, 117, and 119. If any of NFETs 105, 117, or 119 is on, output line 111 is grounded via the conducting NFET, line 217, and NFET 115.

Advantages of circuit 301 over prior-art circuit 101 include the following:

The compensating current on line 211 is exactly the same as the leakage current on line 217; consequently, it is much less likely than the compensating current from the prior-art PFET 107 of FIG. 1 to affect the behavior of gates which take output line 111 as an input.

NFET 309 is the same kind of device as NFETs 105, 117, and 119 and is in the same region of circuit 301; similarly, NFET 302 is the same kind of device as NFET 115 and is located in the same region of circuit 301 as that device; NFETs 309 and 302 are thus subject to the same local conditions as NFETs 105, 117, 119, and 115 and the effect of those local conditions on the leakage current in line 209 will be substantially the same as their effect on the leakage current in line 211. The compensating current in line 211 will therefore always compensate exactly for the effect of the local conditions on NFETs 105, 117, 119, and 115.

A BIT LINE WITH LEAKAGE COMPENSATION IN A DYNAMIC CMOS PLA: FIG. 4

The advantages enumerated above for circuits employing leakage detection component 205 and leakage current compensation component 207 become even more important in dynamic CMOS integrated circuits in which large numbers of FETs are connected to a single node. Examples of such circuits are dynamic CMOS memories and dynamic CMOS PLAs. Discussion of these circuits may be found at pages 336-341 and 216-221 respectively of Shoji. The following discussion of the employment of components 205 and 207 in a CMOS PLA is exemplary for their use in any such circuit.

PLAs are employed generally to implement almost completely random logic such as that required to generate state vectors in microprocessors. When a first sequence of bits representing a state vector is input to the PLA, the PLA responds by outputting a second sequence of bits representing another state vector. In state-of-the-art microprocessors, the number of bits representing a state vector may be very large. The number of bits in turn governs the number of FETs which may be connected to a single output line; in a PLA implementing a complex state machine, there may be 100 or more FETs connected to a single output line.

Figure 4:
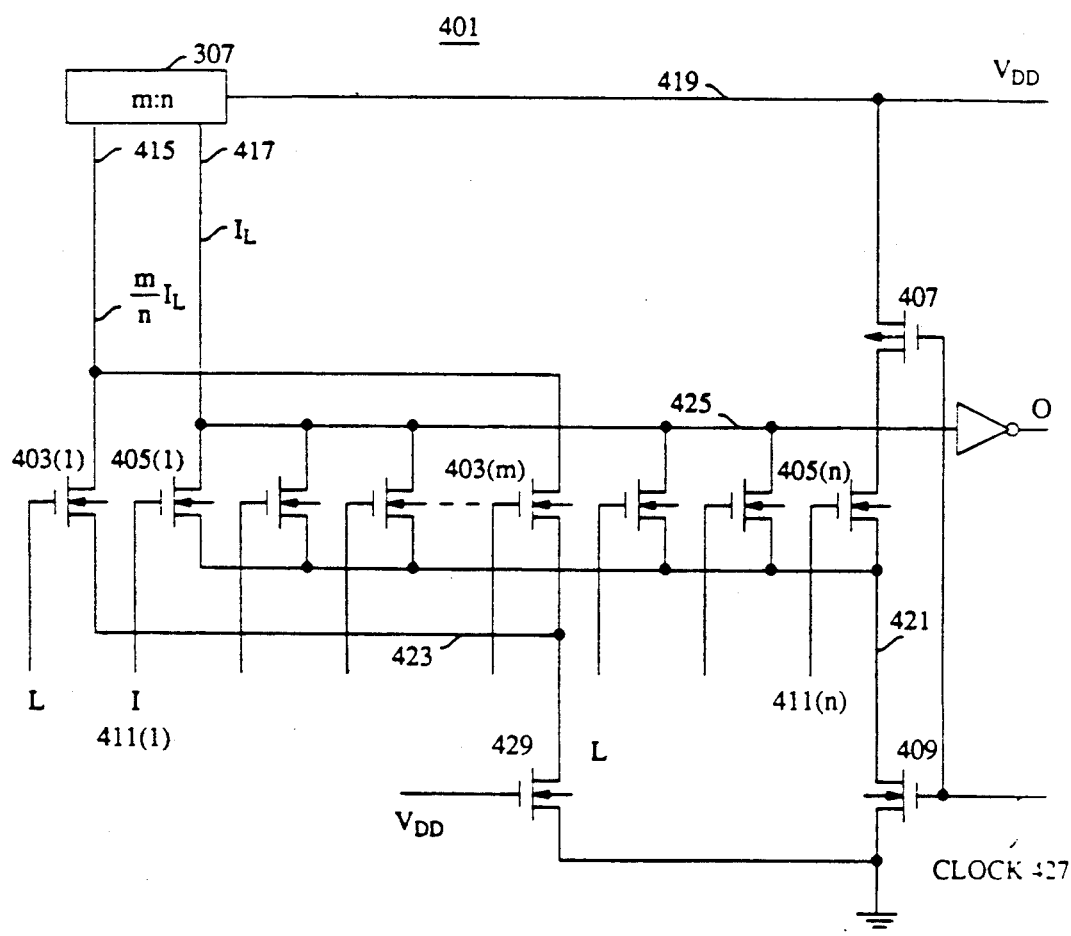
FIG. 4 is a schematic diagram of a portion of a dynamic CMOS PLA embodying the apparatus.

FIG. 4 shows circuit 401 employing components 205 and 207 for a single such output line 425. Circuit 401 is essentially a version of NOR gate 301 which has many more than three logic inputs. As in circuit 301, each logic input is connected to the gate of a NFET; here, the inputs are labeled I 411(1 ... n) and the NFETs corresponding to the inputs are labeled 405(1 ... n). Each of NFETs 405(1 ... n) is connected between output line 425 and line 421. Interspersed among NFETs 405(1 ... n) are the NFETs 403(1 ... m) which make up leakage detection element 205 in circuit 401. NFETs 403 and NFETs 405 are as close to being identical as processing errors allow. In circuit 401, NFETs 403 are interspersed at regular intervals, with one NFET 403 for each three NFETs 405. In other embodiments, other intervals may be chosen and the intervals may not be regular. Each NFET 403 is connected to line 415 and to line 423, which in turn is connected to NFET 429, which is always on. NFET 429 is in the same region of circuit 401 as the ground switch, NFET 409. Consequently, the leakage current in line 415 is proportional to the leakage current in line 425 when all of NFETs 415(1 ... n) are off and line 42 is at ground. Like circuit 301, circuit 401 also includes a precharge PFET, here indicated by reference number 407. Current mirror 307 produces a compensation current in line 417 in response to the current in line 415. Since NFETs 403(1 ... m) NFETs 405(1 ... n) are identical, as are NFETs 429 and 409, the ratio of the current in line 415 to the leakage current in line 421 is the same as the ratio of NFETs 403 to NFETs 405, in this case m:n, and current mirror 307 accordingly produces a compensating current in line 417 whose ratio to the current in line 415 is also m:n, where m represents the curent in line 415 and n the current in line 417.

Operation of circuit 401 is analogous to that of circuit 301. When clock signal 427 is low, PFET 407 is on, precharging output line 425. When clock signal 427 goes high, PFET 407 is turned off and NFET 409 is turned on. As NFETs 403(1 ... m) leak, current mirror 307 provides current on line 417 which is equal to the amount being lost by leakage currents in NFETs 405(1 ... n). As long as none of input lines I(1 ... n) is at a high voltage, output 425 remains at $V_{DD}$; if one or more of input lines I(1 ... n) is at a high voltage, turning on one or more NFETs 405, output line 425 is grounded via the turned on NFETs 405 and NFET 409.

The advantages of circuit 401 over prior art circuits employing equivalents of PFET 103 of circuit 101 to compensate for leakage current are even greater than those of circuit 301. The reason is that the large number of NFETs 405 connected to output line 425 and the increased density of the circuit work to decrease the difference between $n \cdot I_L$ and $I_O$ and at the same time work to increase the effects on $n \cdot I_L$ of local conditions such as device size, temperature, and noise.

CONCLUSION

The foregoing Detailed Description has shown how one of ordinary skill in the art may make and use integrated circuits which compensate for the effects of local conditions within the integrated circuits which compensate for the effects of local conditions within the integrated circuit. The particular examples disclosed herein have shown how dynamic CMOS circuits may be constructed in which leakage currents are exactly compensated for. The invention is, however, not limited to compensation for leakage currents or to dynamic CMOS circuitry, and the principles embodied in the dynamic CMOS circuits may be applied with regard to phenomena other than leakage currents and in integrated circuits employing technologies other than dynamic CMOS. The Detailed Description is thus in all respects illustrative and exemplary, and the scope of the invention is defined solely by the claims as interpreted in light of the doctrine of equivalents.

What is claimed is:

1. Apparatus for compensating for a local condition which affects a portion of an integrated circuit which is less than the entire integrated circuit, the apparatus comprising:
   a detecting element in the portion which is subject to the local condition and produces a response thereto which is proportional to the effect of the local condition on another element in the portion; and
   compensation means coupled to the detecting element and to the portion for reacting to the response of the detecting element to the local condition by providing a compensating input to the portion which is proportional to the response and which compensates for the effect of the local condition on the other 11 element.

2. The apparatus set forth in claim 1 wherein:
   the detecting element is affected by the local condition in the same fashion as the other element and the detecting element's response to the local condition is proportional to the response of the other element thereto.

3. The apparatus set forth in claim 1 wherein:
   there is a plurality of local conditions local to different parts of the portion;

there is a plurality of other elements located in the different parts;

there is a plurality of detecting elements interspersed with the other elements; and the compensation means reacts to the response of the plurality of detecting elements.

4. The apparatus set forth in claim 3 wherein:

the detecting elements are affected by the local conditions in the same fashion as the other elements and the detecting elements' responses to the local conditions are proportional to the responses of the other elements thereto.

5. Apparatus for compensating for a local condition in an integrated circuit which affects a first leakage current and which is local to a portion of the integrated circuit which is less than the entire integrated circuit, the apparatus comprising:

leakage current determination means incorporated into the portion which has a second leakage current which is proportional to and varies with the first leakage current; and compensating current providing means coupled to the leakage current determination means and to the portion for responding to the second leakage current by producing a compensating current substantially equal to the first leakage current and providing the compensating current to the portion.

6. The apparatus set forth in claim 5 wherein:

the first leakage current is primarily a consequence of leakage through a first device in the portion and the leakage current determination means is a second device in the portion which has a leakage proportional to the leakage of the first device.

7. The apparatus set forth in claim 6 wherein:

the second device is electrically equivalent to the first device and has substantially the same geometry and orientation.

8. The apparatus set forth in claim 6 wherein:

the first device is one of a first plurality thereof;

the second device is one of a second plurality thereof which are interspersed with the devices of the first plurality; and the second leakage current is the sum of the leakage of the second devices.

9. The apparatus set forth in claim 8 wherein:

the second devices have substantially the same leakage as the first devices.

10. The apparatus set forth in claim 8 wherein:

the second devices are electrically equivalent to the first devices and have substantially the same geometry and orientation.

11. The apparatus set forth in any one of claims 5 through 10 wherein:

the compensating current providing means is a current mirror which responds to the second leakage current to produce the compensating current.

12. Apparatus for compensating for a local condition in an integrated circuit which affects a first leakage current in a first FET and which is local to a portion of the integrated circuit which contains the first FET but is less than the entire integrated circuit, the apparatus comprising:

a second FET which is located in the portion and which has a second leakage current which is affected by the local condition and which is proportional to the first leakage current; and a current mirror having a first side coupled to the second FET and a second side coupled to the first FET which responds to the second leakage current flowing through first side by producing a compensating current in the second side which is substantially equal to the first leakage current.

13. The apparatus set forth in claim 12 wherein:

the first FET is one of a first set thereof;

the second FET is one of a second set thereof;

the first and second leakage currents are substantially the same; and the sum of the second leakage currents from the FETs in the second set flows through the first side of the current mirror and the ratio of the compensating current to the sum of the second leakage currents is substantially the same as the ratio of the number of FETs in the first set to the number of FETs in the second set.

14. The apparatus set forth in claim 13 wherein:

the first leakage current is affected by local conditions; and

FETs in the second set are subject to the same local conditions as FETs in the first set, whereby the local conditions affect the second leakage current as well as the first leakage current.

15. The apparatus set forth in claim 14 wherein:

the FETs in the second set are interspersed among the FETs in the first set.

* * * * *